US007348645B2

(12) United States Patent
Xu

(10) Patent No.: US 7,348,645 B2
(45) Date of Patent: Mar. 25, 2008

(54) INTELLIGENT TEXTILE TECHNOLOGY BASED ON FLEXIBLE SEMICONDUCTOR SKINS

(75) Inventor: Yong Xu, Troy, MI (US)

(73) Assignee: Wayne State University, Detroit, MI (US)

( * ) Notice: Subject to any disclaimer, the term of this patent is extended or adjusted under 35 U.S.C. 154(b) by 122 days.

(21) Appl. No.: 11/128,570

(22) Filed: May 13, 2005

(65) Prior Publication Data

US 2006/0255433 A1 Nov. 16, 2006

(51) Int. Cl.
*H01L 29/84* (2006.01)

(52) U.S. Cl. ........................................ 257/415; 438/50

(58) Field of Classification Search ................ 257/643, 257/415; 438/964, 50
See application file for complete search history.

(56) References Cited

U.S. PATENT DOCUMENTS 4,587,719 A 5/1986 Barth
6,071,819 A 6/2000 Tai et al.
6,210,771 B1 4/2001 Post et al.

OTHER PUBLICATIONS

"Electronic Textiles for Wearable Computing Systems", Tunde Kirstein, Jose Bonan and Didier Cottet and Gerhard Troster, Computer-Electronic, 2002, pp. 1-9.
"Ready to Ware", D. Marculescu, R. Marculescu, S. Park and S. Jayaraman, SPECTRUM, IEEE, vol. 40, pp. 28-32, 2003.
"Electronics in Textiles The Next Step in Man Machine Interaction", presented at The 2nd Crest Workshop on Advanced Computing and Communicating Techniques for Wearable Information Playing , Nara Institute of Science Technology, Nara, Japan, 2003.
"Flexible Circuit and Sensor Arrays Fabricated by Monolithic Silicon Technology", P.W. Barth, S.L. Bernard and J.B. Angell, IEEE Transactions on Electron Devices, vol. 32, pp. 1202-1205, 1985.
"A Flexible Mems Technology and its First Application to Shear Stress Sensor Skin", F. Jiang, Y.-C. Tai, K. Walsh, T. Tsao, G.-B. Lee & D.-M. Ho, presented at IEEE International Conference on Micro Electro Mechanical Systems (MEMS), Nagoya, Japan, 1997.
"IC-Integrated Flexible Shear-Stress Sensor Skin", Y. Xu, Y.-C. Tai, A. Huang, & C.-M. Ho, presented at Solid-State Sensor, Actuator, and Microsystems Workshop, Hilton Head Island, South Carolina, 2002.
"The Wearable Motherboard: A Framework for Personalized Mobile Information Processing (PMIP)", S. Park, K. Mackenzie S. Jayaram, presented at 39TM Design Automation Conference, New Orleans, LA, United States, 2002.
"E-broidery: Design and Fabrication of Textile-Based Computing", E.R. Post, M. Orth, P.R. Russo & N. Gershenfeld, IBM Systems Journal, vol. 39, pp. 840-860, 2000.

*Primary Examiner*—Steven Loke
*Assistant Examiner*—Earl Taylor
(74) *Attorney, Agent, or Firm*—Brooks Kushman P.C.

(57) ABSTRACT

A semiconductor-containing flexible skin suitable for use in intelligent textile applications includes a metal layer, an insulating layer, and one or more semiconductor islands sandwiched between a first flexible polymer layer and a second flexible polymer layer. Various electronics and sensors can be advantageously incorporated on the semiconductor islands. The metal layer of the invention is patterned into conducting paths that allow electrical communication between the semiconductor islands and to any devices connected to flexible skin. Moreover, the insulating layer is disposed between the metal layer and semiconductor islands. An intelligent textile includes the semiconductor-containing flexible skin attached to a fabric. Specifically, opening in the flexible textile allow direct weaving with textiles. A method of forming the flexible skin and intelligent fabric is also provided.

26 Claims, 4 Drawing Sheets

16 52 16 52 52 10 50 52 52 16 16

INTELLIGENT TEXTILE TECHNOLOGY BASED ON FLEXIBLE SEMICONDUCTOR SKINS

BACKGROUND OF THE INVENTION

1. Field of the Invention

The present invention relates to intelligent textile technology based on the integration of semiconductor flexible skins with textiles.

2. Background Art

As semiconductor microfabrication technology has advanced, integrated circuit based devices have been incorporated into a number of non-conventional applications. Examples of microfabrication technology include both standard microelectronic integrated circuit technology and micro-electro-mechanical systems ("MEMS") technology. Although these two technologies have considerable process overlap, MEMS is generally regarded as pertaining to the integration of mechanical elements, sensors, actuators, and electronics on a silicon substrate exclusive of integrated circuit technology. Although the distinction is somewhat gray, both technologies together provide the ability to create smart systems in which MEMS components allow the collection of information or the manipulation of an external device with the integrated circuit components allowing the analysis of the collected information and decision making ability.

A particularly important recent application for the incorporation of microfabrication technology is the fabrication of intelligent textile technology. Such intelligent textiles combine a fabric or cloth with various electronics and transducers. Such intelligent textiles have alternatively been referred to as smart fabrics, electronic textiles, or e-textiles. Applications of such textiles is expanding into many areas including such diverse fields as medicine, military, and entertainment. For example, smart shirts have been developed which incorporate a microphone, sensors, optical fibers, a databus, and a panel to control the smart shirt. Similarly, prototype sudden infant death syndrome (SIDS) suits that detect if an infant has stopped breathing are under development. In the entertainment arena, jackets incorporating MP3 players are available. Potential military applications include intelligent uniforms that include communications systems, global positioning technology, batteries, and the like.

Various techniques are used to incorporate electronic devices into textiles. A conceptually simple technique involves merely attaching off the shelf electronic components and/or sensors to textiles. However, this methodology suffers from several drawbacks which include a significant decrease in the flexibility of the textiles, discomfort to the user due to the bulkiness of the components, and an increase in the weight and volume of the textiles. In another prior art technology, components that are flexible are fabricated. Specifically, the electronic components and transducers used in an e-textile are flexible. Although this prior art technology is simple and cheap, it too suffers from several drawbacks. For example, this methodology tends to be temperature limited. Moreover, such technologies exhibit difficulties in transplanting MEMS devices based on silicon and other rigid materials and in integrating electronics. Moreover, devices are often stressed when the flexible substrate bends.

Accordingly, there exists a need for improved semiconductors based flexible skins that are compatible with current integrated circuits and MEMs technology and for methods of forming such flexible skins.

SUMMARY OF THE INVENTION

The present invention overcomes the problems encountered in the prior art by providing in one embodiment a semiconductor-containing flexible skin suitable for use in intelligent textile applications. In one embodiment, the flexible skin of the invention includes a metal layer, an insulating layer, and one or more semiconductor islands sandwiched between a first flexible polymer layer and a second flexible polymer layer. The first and second flexible polymer layers both protect and support the one or more semiconductor islands, the metal layer, and the insulating layer. The metal layer of the invention is typically patterned into conducting wires or paths that allow electrical communication between the semiconductor islands and to any devices connected to flexible skin. Moreover, the insulating layer is disposed between metal layer and semiconductor islands.

In another embodiment of the invention, a woven textile incorporating the semiconductor-containing skin of the invention is provided. The flexible skin of the invention may be attached to a textile by any mechanism including adhesion, weaving, stapling, and the like.

In yet another embodiment of the invention, a method of making the semiconductor-containing flexible skin of the invention is provided. The method of the invention comprises providing a semiconductor substrate over-coated with a bilayer comprising an insulating layer and a metal layer, such that the insulating layer is disposed between the metal layer and-the semiconductor substrate. A portion of an exposed side of the metal layer is then coated with a first flexible polymer layer. A portion of the semiconductor substrate is removed to form a plurality of semiconductor islands attached to the insulating layer. Finally, an opposite side of the semiconductor islands are coated with a second flexible polymer layer.

DETAILED DESCRIPTION OF THE PREFERRED EMBODIMENT(S)

Reference will now be made in detail to presently preferred compositions or embodiments and methods of the invention, which constitute the best modes of practicing the invention presently known to the inventors.

Figure 1:
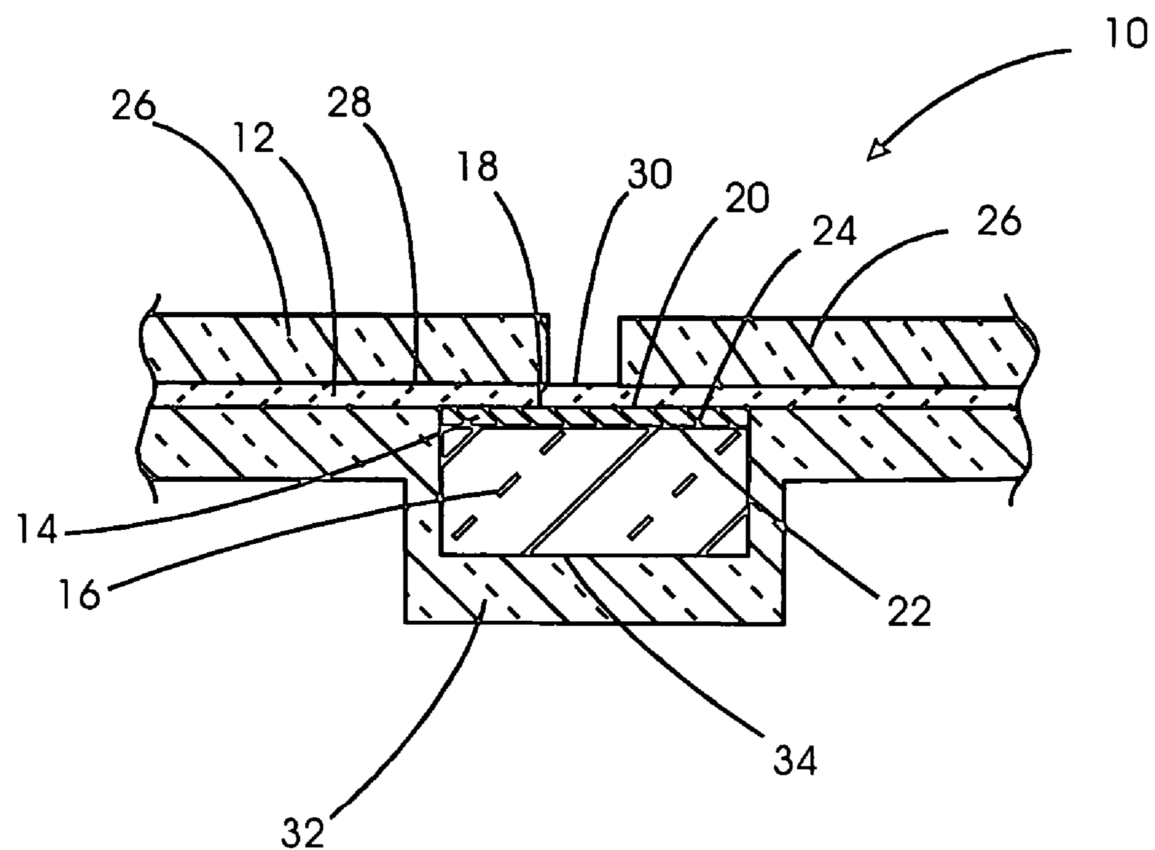
FIG. 1 is a cross section of the semiconductor-containing flexible skin of the invention showing the supporting of semiconductor islands by an embodiment in which two flexible polymer layers are utilized.
Figure 2:
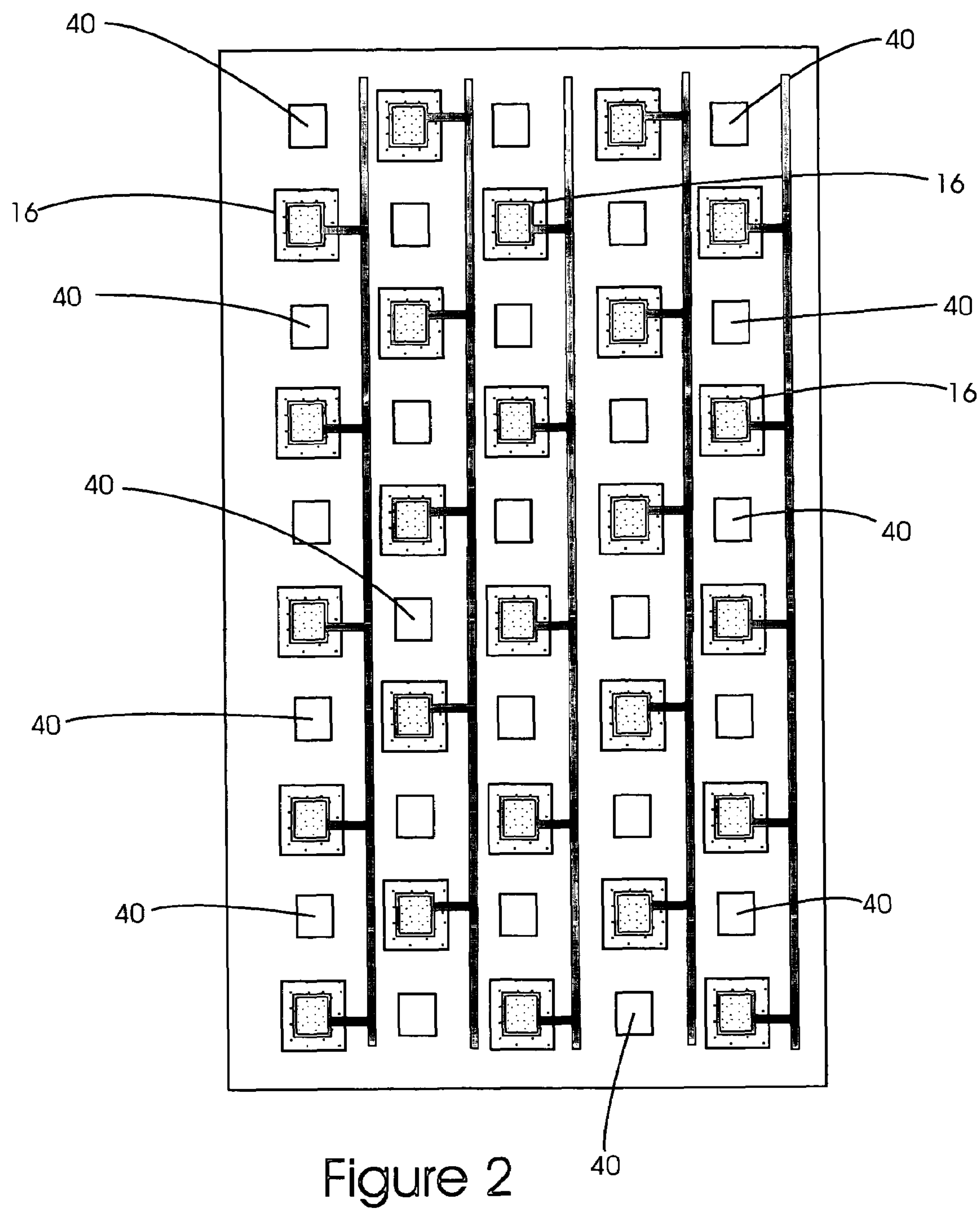
FIG. 2 is a top view of the flexible skin of the invention illustrating the incorporation of openings that allow attachment of the skin to a fabric.

With reference to FIGS. 1 and 2, an embodiment of the present invention providing a semiconductor-based flexible skin suitable for use in intelligent textile applications is described. Flexible skin 10 includes metal layer 12, insulating layer 14, and one or more semiconductor islands 16. Metal layer 12 is typically patterned into conducting wires that allow electrical communication between the semiconductor islands 16 and to any devices connected to flexible skin 10. Insulating layer 14 is disposed between metal layer 12 and semiconductor islands 16. Specifically, insulating layer 14 is disposed over at least a portion of metal layer 12 such that first metal side 18 is adjacent to first insulating side 20. Similarly, semiconductor islands 16 are disposed over one or more regions of insulating layer 14 such that first side 22 of the semiconductor islands 16 are adjacent to second insulating side 24. First flexible polymer layer 26 is disposed over at least a portion of metal layer 12 on second metal side 28. Portions of metal layer 14 may or may not be coated with first flexible polymer layer 26 in order to allow electrical contact to be made to metal layer 12. Such exposed metal regions 30 are useful when conductive yarns are used to attach flexible skin 10 to a textile. First flexible polymer layer 26 provides a supporting substrate for semiconductor islands 16. In one variation of the invention, flexible skin 10 further includes second flexible polymer layer 32 disposed over at least a portion of second side 34 of semiconductor islands 16 covering second side 34 of semiconductor islands and optionally at least a portion of any exposed regions of metal side 14, insulating layer 14, and first polymer layer 26. Second flexible polymer layer 32 provides additional support to semiconductor islands 16. It should be appreciated that first flexible polymer layer 26 and second flexible polymer layer 32 may be made from a number of techniques which include for example spin coating, spray coating, or by vapor-phase deposition. Finally, flexible skin 10 optionally includes a plurality of openings 40 that allow flexible skin to be attached to a fabric.

First flexible polymer layer 26 and second flexible polymer 32 are made from any polymeric material that is durable and flexible. Suitable polymer materials include polyimides, polyetherimide, fluropolymers, nylons, parylenes, and combinations thereof. Polyimides are particularly useful because of the enhanced stabilities of these materials.

As set forth above, flexible skin 10 include one or more of semiconductor islands 16. In one variation of the invention, flexible skin 10 includes a plurality of semiconductor islands 16. Typically, semiconductor islands include one or more microelectronic circuits or sensors. Moreover, semiconductor islands comprise a semiconductor selected from the group consisting of silicon, germanium, gallium arsenide, and combinations thereof.

Flexible skin 10 includes metal layer 12 and insulating layer 14. Metal layer 12 may be formed from any suitable metal so long as there is sufficient conductivity for electrical communication between semiconductor islands 16. Suitable metals include copper, silver, chromium, aluminum, gold, titanium, platinum, and combinations thereof. Metal layer 12 may be formed by any suitable process compatible with the other layers in flexible skin 10. Suitable processes include, for example, sputtering, evaporation, electroplating, chemical vapor deposition, and the like. Insulating layer 14 is formed from a number of suitable insulating materials. Suitable insulating materials include, for example, insulating oxides, insulating nitrides, insulating polymeric materials, and combinations thereof. Examples of such insulating materials include silicon oxide, tin oxide, zirconium oxide, zinc oxide, tantalum oxide, titanium oxide, silicon nitride, parylene, polyimide, and combinations thereof.

Figure 3:
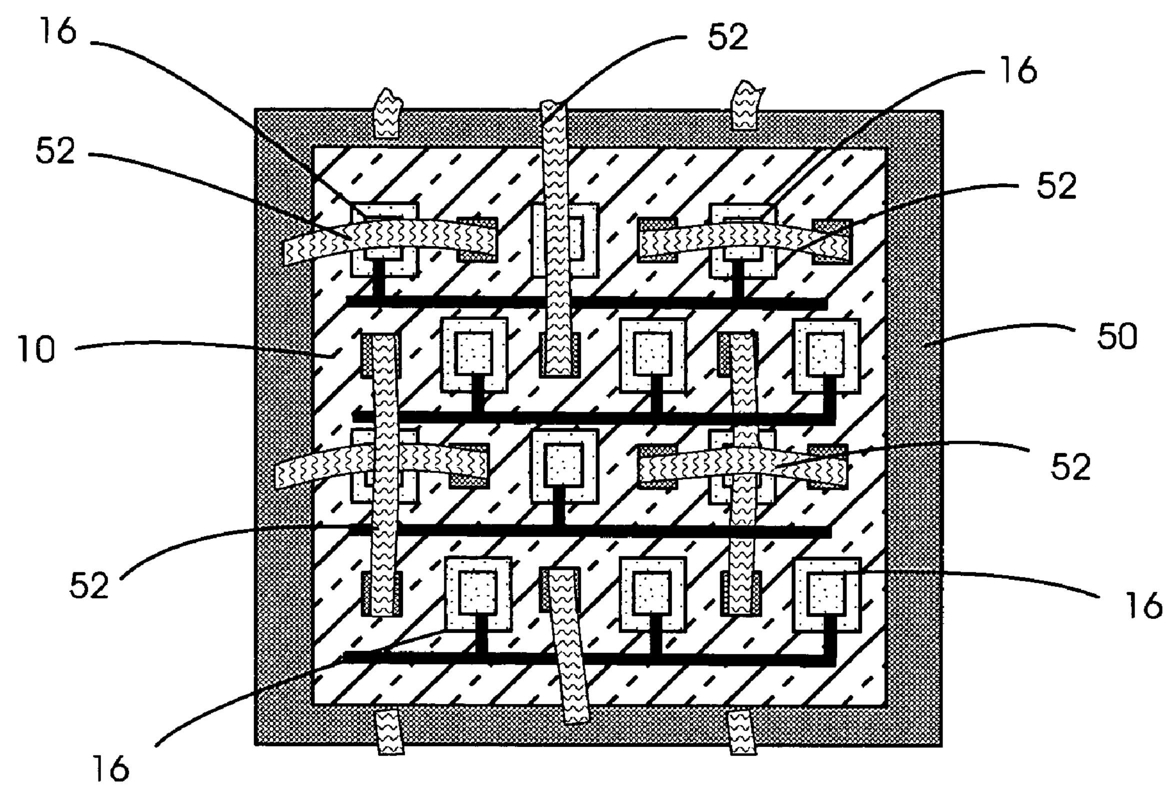
FIG. 3 is a top view demonstrating the attachment of the flexible skin of the invention to a fabric.

With reference to FIG. 3, a woven textile that includes the semiconductor-based flexible textile of the invention is provided. Semiconductor-based flexible skin 10 is attached to textile layer 50. Typically, the attachment to textile layer 50 is accomplished via plurality of holes 40 in flexible skin 10. For example, thread or yarn 52 passes through plurality of openings 40, thereby attaching the semiconductor-based flexible layer to the textile. In some variations, thread or yarn 52 is conductive, thereby making electrical contact with metal layer 12 at exposed positions 30.

Figure 4:
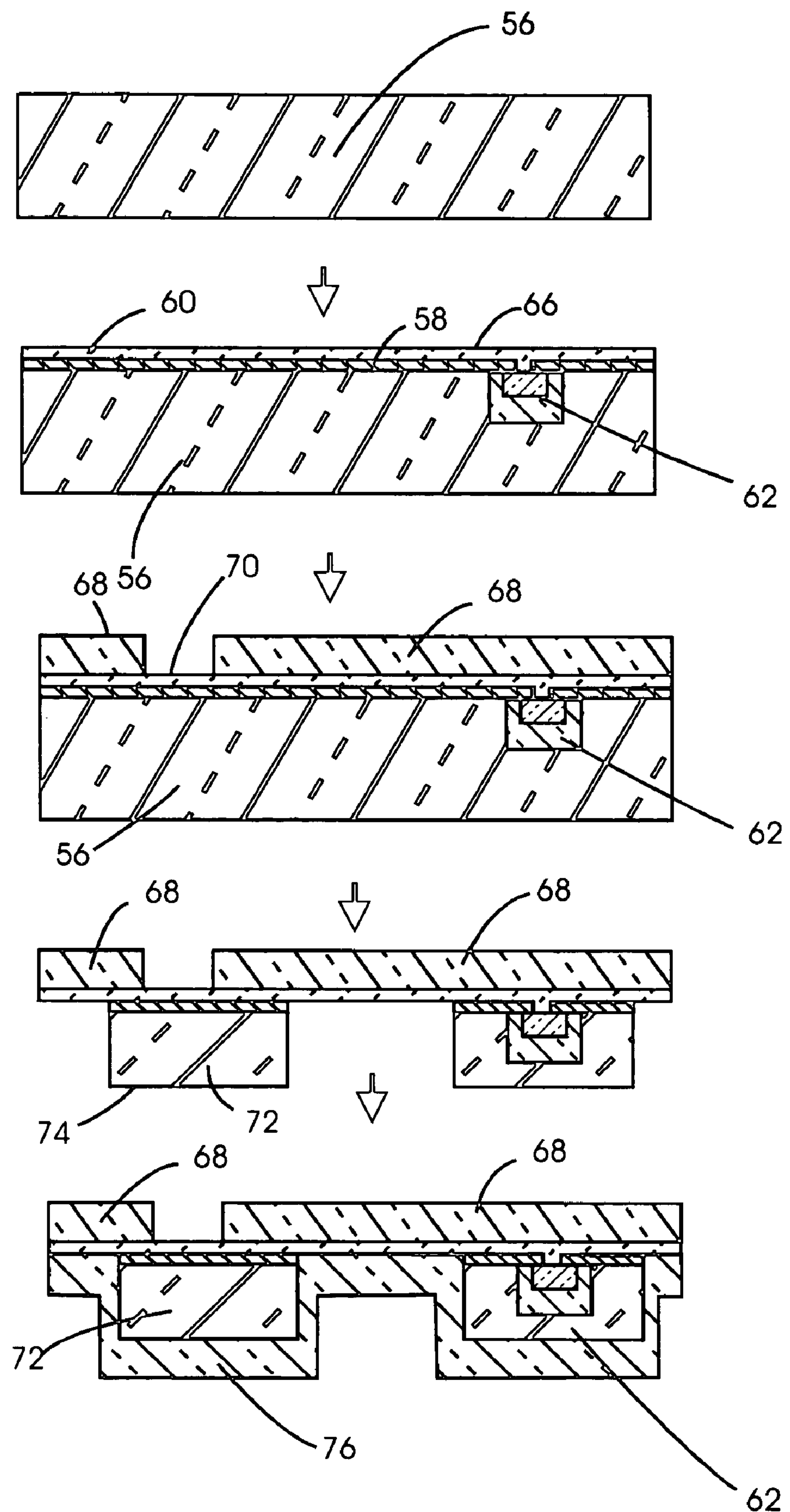
FIG. 4 is a flow diagram demonstrating in cross section the method of the invention.

In another embodiment of the invention, a method of making the flexible semiconductor skin set forth above from a semiconductor substrate is provided. With references to FIG. 4, semiconductor substrate 56 is over-coated with a bilayer comprising oxide layer 58 and metal layer 60 such that the oxide layer 58 is disposed between metal layer 60 and semiconductor substrate 56. In some variations, substrate 60 includes one or more electronic systems or sensors 62 that are prefabricated prior to formation of the flexible semiconductor skin. It should be appreciated that prior to the fabrication of skin structures, electronics and sensors can be fabricated first on the semiconductor substrate using existing technologies and variations thereof. At least a portion of an exposed side 66 of metal layer 60 is coated with a flexible polymer to form first flexible polymer layer 68 disposed over metal layer 60. Flexible polymer layer 68 is optionally patterned to provide exposed section 70 of metal layer 60 to allow electrical contact with a yarn as set forth above. Next, semiconductor substrate 56 is patterned by removing a portion of semiconductor substrate 56 such that a plurality of semiconductor islands 72 remain attached to the oxide layer. Typically, the step of removing a portion of the semiconductor substrate comprises etching the semiconductor substrate from the side furthest from the first flexible polymer layer. Although various wet etch techniques may be utilized, deep reactive ion etching is particularly useful. Exposed side 74 of semiconductor islands 72 are coated with a protective layer 76 that is typically a second flexible polymer layer. The details of the first and second polymer layers are the same as that set forth above for the flexible skin of the invention. The method of the invention optionally further comprises forming a plurality of openings, allowing the flexible semiconductor skin to be attached to a textile. Such openings allow the attachment of the flexible semiconductor skin with a yarn or thread as set forth above.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A textile comprising:

a semiconductor-based flexible skin including:

a metal layer having a first metal side and a second metal side;

an insulating layer having a first insulating side and a second insulating side, the insulating layer being disposed over at least a portion of the metal layer such that the first metal side is adjacent to the first insulating side;

a first flexible polymer layer disposed over at least a portion of the metal layer on the second metal side; and a plurality of semiconductor islands disposed over one or more regions of the insulating layer such that a first side of at least some of the one or more semiconductor islands is adjacent to the second insulating side, wherein the flexible skin defines a plurality of openings at positions that are different than positions where the plurality of semiconductor islands are located, the plurality of openings allowing the flexible skin to be woven into a textile; and a textile layer attached to the semiconductor-based flexible skin via the plurality of openings.

2. The textile of claim 1 wherein the semiconductor-based flexible skin further comprises a second flexible polymer layer disposed over a second side of at least some of the plurality of semiconductor islands and at least some of any exposed regions of the metal layer, of the insulating layer, and of the first polymer layer.

3. The textile of claim 2 wherein the first and second flexible polymer layers each comprise a component selected from the group consisting of polyimides, polyetherimide, fluropolymers, nylons, parylenes, and combinations thereof.

4. The textile of claim 2 wherein the first and second polymer layers each individually comprise a component selected from the group consisting of polyimides.

5. The textile of claim 1 wherein one or more semiconductor islands of the plurality of semiconductor islands include a component selected from the group consisting of one or more microelectronic circuits, one or more sensors, and combinations thereof.

6. The textile of claim 1 wherein the one or more semiconductor islands comprise a semiconductor selected from the group consisting of silicon, germanium, gallium arsenide, and combinations thereof.

7. The textile of claim 1 wherein the metal layer comprises a metal selected from the group consisting of copper, silver, chromium, aluminum, gold, titanium, platinum, and combinations thereof.

8. The textile of claim 1 wherein the insulating layer comprises a material selected form the group consisting of insulating oxides, insulating nitrides, polymeric materials, and combinations thereof.

9. A woven textile comprising:

a semiconductor-based flexible skin comprising:

- a metal layer having a first metal side and a second metal side;
- an insulating layer having a first insulating side and a second insulating side, the insulating layer being disposed over the metal layer such that the first metal side is adjacent to the first insulating side;
- a first flexible polymer layer disposed over at least a portion of the metal layer on the second metal side;
- a plurality of semiconductor islands disposed over one or more regions of the insulating layer such that a first side of at least some of the one or more semiconductor islands is adjacent to the second insulating side; and
- a second flexible polymer layer disposed over a second side of the at least some of the plurality of semiconductor islands; and a textile layer attached to the semiconductor-based flexible skin.

10. The woven textile of claim 9 wherein the semiconductor-based flexible skin defines a plurality of openings that allow the textile layer to be attached to the semiconductor-based flexible, the openings being located at positions that are different than positions having the plurality of semiconductor islands.

11. The woven textile of claim 10 further comprising a conductive thread or a conductive yarn that passes through the plurality of openings, thereby attaching the semiconductor-based flexible layer to the textile.

12. The woven textile of claim 11 wherein the first and second polymer layers each individually comprise a component selected from the group consisting of polyimides, polyetherimide, fluropolymers, nylons, parylenes, and combinations thereof.

13. The woven textile of claim 12 wherein the one or more semiconductor islands comprise a semiconductor selected from the group consisting of silicon, germanium, gallium arsenide, and combinations thereof.

14. A method of making a textile having a flexible semiconductor skin formed from a semiconductor substrate, the semiconductor substrate being over-coated with a bilayer comprising an insulating layer and a metal layer such that at least part of the insulating layer is disposed between the metal layer and the semiconductor substrate, the method comprising;

1) forming the flexible semiconductor skin by the steps of:
   - a) coating at least a portion of an exposed side of the metal layer with a flexible polymer to form a first flexible polymer layer disposed over the metal layer;
   - b) removing a portion of the semiconductor substrate such that a plurality of semiconductor islands attached to the insulating layer remains; and
   - c) coating the semiconductor islands with a protective layer; and
2) attaching the flexible semiconductor skin to a textile.

15. The method of claim 14 wherein step a) includes patterning the first flexible polymer layer.

16. The method of claim 14 wherein the first flexible polymer layer is applied by spin coating, spray coating, or by vapor-phase deposition.

17. The method of claim 14 wherein the protective layer comprises a second flexible layer.

18. The method of claim 17 wherein the first and second polymer layers each individually comprise a component selected from the group consisting of polyimides, polyetherimide, fluropolymers, nylons, parylenes, and combinations thereof.

19. The method of claim 17 wherein the first and second polymer layers each individually comprise a component selected from the group consisting of polyimides.

20. The method of claim 14 wherein one or more semiconductor islands of the plurality of semiconductor islands include one or more microelectronic circuits or sensors.

21. The method of claim 14 wherein the one or more semiconductor islands comprise a semiconductor selected from the group consisting of silicon, germanium, gallium arsenide, and combinations thereof.

22. The method of claim 14 wherein the metal layer comprises a metal selected from the group consisting of copper, silver, chromium, aluminum, gold, titanium, platinum, and combinations thereof.

23. The method of claim 14 wherein the insulating layer comprising an material selected from the group consisting of insulating oxides, insulating nitrides, polymeric materials, and combinations thereof.

24. The method of claim 14 wherein the step of removing a portion of the semiconductor substrate comprises etching the semiconductor substrate from the side furthest from the first flexible polymer layer.

25. The method of claim 14 wherein the step of removing a portion of the semiconductor substrate comprises deep reactive ion etching.

26. The method of claim 14 further comprising forming a plurality of openings allowing the flexible semiconductor skin to be attached to a textile.

* * * * *

UNITED STATES PATENT AND TRADEMARK OFFICE

CERTIFICATE OF CORRECTION

PATENT NO. : 7,348,645 B2
APPLICATION NO. : 11/128570
DATED : March 25, 2008
INVENTOR(S) : Yong Xu It is certified that error appears in the above-identified patent and that said Letters Patent is hereby corrected as shown below:

Column 5, Line 28, Claim 8:
Delete “form” and insert -- from --.

Column 6, Line 50, Claim 23:
Delete “an” and insert -- a --.

Signed and Sealed this

Second Day of December, 2008

JON W. DUDAS
*Director of the United States Patent and Trademark Office*